(12) United States Patent
Miyamoto et al.

(10) Patent No.: US 8,485,126 B2
(45) Date of Patent: Jul. 16, 2013

(54) COATING APPARATUS INCLUDING A GLOVE PART AND A CONTROLLER FOR STOPPING COATING

(75) Inventors: Hidenori Miyamoto, Kawasaki (JP); Kenji Maruyama, Kawasaki (JP); Tadahiko Hirakawa, Kawasaki (JP); Koichi Misumi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 312 days.

(21) Appl. No.: 12/874,117

(22) Filed: Sep. 1, 2010

(65) Prior Publication Data
US 2011/0059574 A1 Mar. 10, 2011

(30) Foreign Application Priority Data
Sep. 8, 2009 (JP) ................................. 2009-207141

(51) Int. Cl.
*B05C 11/00* (2006.01)
*B05C 13/00* (2006.01)
*H01L 21/00* (2006.01)

(52) U.S. Cl.
USPC ............. 118/679; 118/663; 118/678; 118/64; 438/95; 438/909

(58) Field of Classification Search
USPC ............................... 118/58, 64, 679, 692, 688
See application file for complete search history.

(56) References Cited

U.S. PATENT DOCUMENTS

| 4,143,468 | A | | 3/1979 | Novotny et al. |
| 4,150,494 | A | | 4/1979 | Rothchild |
| 4,557,868 | A | * | 12/1985 | Page et al. ..................... 540/143 |
| 4,683,143 | A | * | 7/1987 | Riley ................................. 427/8 |
| 4,793,283 | A | * | 12/1988 | Sarkozy ......................... 118/725 |
| 4,832,986 | A | * | 5/1989 | Gladfelter et al. .......... 427/248.1 |
| 5,045,409 | A | | 9/1991 | Eberspacher et al. |
| 5,322,706 | A | * | 6/1994 | Merkel et al. ..................... 427/8 |
| 5,325,705 | A | * | 7/1994 | Tom ............................. 73/31.03 |
| 5,358,740 | A | | 10/1994 | Bornside et al. |
| 5,454,256 | A | | 10/1995 | Gimben et al. |

(Continued)

FOREIGN PATENT DOCUMENTS
JP H01-231313 9/1989
JP H11-273783 10/1990

(Continued)

OTHER PUBLICATIONS

Office Action issued in U.S. Appl. No. 12/875,613 on Aug. 3, 2012.

(Continued)

*Primary Examiner* — Dah-Wei Yuan
*Assistant Examiner* — Karl Kurple
(74) *Attorney, Agent, or Firm* — Knobbe Martens Olson & Bear LLP

(57) ABSTRACT

A coating apparatus including a coating part which applies a liquid material including an oxidizable metal on a substrate; a chamber having a coating section in which the coating part applies the liquid material on the substrate and a transport section into which the liquid material is transported; an adjusting part which adjusts at least one of oxygen concentration and humidity inside the chamber; and a control part which stops an operation of the coating part in response to the entrance of foreign object into the chamber.

3 Claims, 4 Drawing Sheets

U.S. PATENT DOCUMENTS

| | | | |
|---|---|---|---|
| 5,527,389 A * | 6/1996 | Rosenblum et al. | 118/58 |
| 5,725,644 A * | 3/1998 | Sano et al. | 106/31.48 |
| 5,912,043 A * | 6/1999 | Choi et al. | 427/8 |
| 6,054,181 A * | 4/2000 | Nanbu et al. | 427/240 |
| 6,161,311 A * | 12/2000 | Doley et al. | 34/548 |
| 6,287,023 B1 * | 9/2001 | Yaegashi et al. | 396/565 |
| 6,296,806 B1 * | 10/2001 | Kishkovich et al. | 422/52 |
| 6,299,277 B1 | 10/2001 | Fujii | |
| 6,636,303 B2 * | 10/2003 | Ina et al. | 356/237.3 |
| 6,875,661 B2 | 4/2005 | Mitzi | |
| 7,193,956 B2 | 3/2007 | Usami et al. | |
| 7,205,558 B2 | 4/2007 | Yoneyama et al. | |
| 7,364,775 B2 * | 4/2008 | Klein | 427/427.2 |
| 7,442,413 B2 | 10/2008 | Zwaap et al. | |
| 7,591,902 B2 | 9/2009 | Rangarajan et al. | |
| 7,638,001 B2 * | 12/2009 | Kawamura | 118/692 |
| 7,662,413 B2 | 2/2010 | Wang et al. | |
| 8,033,244 B2 * | 10/2011 | Minamida et al. | 118/692 |
| 2001/0000759 A1 * | 5/2001 | Doley et al. | 438/488 |
| 2001/0026747 A1 | 10/2001 | Saga | |
| 2003/0166311 A1 * | 9/2003 | Miyazawa | 438/82 |
| 2003/0215573 A1 * | 11/2003 | Nishibayashi | 427/379 |
| 2003/0234851 A1 | 12/2003 | Booth et al. | |
| 2003/0235695 A1 | 12/2003 | Greenberg et al. | |
| 2004/0050321 A1 | 3/2004 | Kitano et al. | |
| 2005/0175775 A1 * | 8/2005 | Shirley | 427/240 |
| 2005/0180744 A1 | 8/2005 | Nakamura et al. | |
| 2006/0029740 A1 * | 2/2006 | Sakurai et al. | 427/335 |
| 2006/0119669 A1 * | 6/2006 | Sharma et al. | 347/82 |
| 2006/0124869 A1 | 6/2006 | Yoneyama et al. | |
| 2006/0138352 A1 | 6/2006 | Tanaka | |
| 2006/0172427 A1 * | 8/2006 | Germouni et al. | 436/55 |
| 2006/0263514 A1 * | 11/2006 | Shirley | 427/8 |
| 2007/0243657 A1 | 10/2007 | Basol et al. | |
| 2008/0139002 A1 * | 6/2008 | Kato | 438/782 |
| 2009/0145482 A1 | 6/2009 | Mitzi et al. | |
| 2009/0205714 A1 | 8/2009 | Kühnlein et al. | |
| 2009/0239360 A1 * | 9/2009 | Sato | 438/502 |
| 2010/0022629 A1 | 1/2010 | Liu et al. | |
| 2010/0189926 A1 | 7/2010 | DeLuca et al. | |
| 2010/0226629 A1 | 9/2010 | Basol et al. | |
| 2010/0326354 A1 | 12/2010 | Sahoda et al. | |
| 2011/0041913 A1 | 2/2011 | Luecke et al. | |
| 2011/0059245 A1 | 3/2011 | Miyamoto et al. | |
| 2011/0059246 A1 | 3/2011 | Miyamoto et al. | |
| 2011/0059248 A1 | 3/2011 | Miyamoto et al. | |
| 2011/0059250 A1 | 3/2011 | Miyamoto et al. | |
| 2011/0059574 A1 | 3/2011 | Miyamoto et al. | |

FOREIGN PATENT DOCUMENTS

| | | |
|---|---|---|
| JP | H11-340482 | 12/1999 |
| JP | 2005-051224 | 2/2005 |
| JP | 2005-175344 | 6/2005 |
| JP | A-2009-537997 | 10/2009 |

OTHER PUBLICATIONS

Office Action issued in U.S. Appl. No. 12/874,101 on Jun. 11, 2012.
Mitzi et al., "A High-Efficiency Solution-Deposited Thin-Film Photovoltaic Device," Advanced Materials 2008, 20, pp. 3657-3662, Aug. 20, 2008.
Office Action issued in U.S. Appl. No. 12/874,101 on Oct. 11, 2012.
Office Action issued on Aug. 31, 2012 for U.S. Appl. No. 12/874,984.
Office Action issued on Jan. 3, 2013 for U.S. Appl. No. 12/874,984.
Office Action issued on Jan. 30, 2013 for U.S. Appl. No. 12/875,613.

* cited by examiner

COATING APPARATUS INCLUDING A GLOVE PART AND A CONTROLLER FOR STOPPING COATING

BACKGROUND OF THE INVENTION

1. Field of the Invention

The present invention relates to a coating apparatus and a coating method.

2. Description of the Related Art

A CIGS solar cell formed by semiconductor materials including a metal such as Cu, Ge, Sn, Pb, Sb, Bi, Ga, In, Ti, and a combination thereof, and a chalcogen element such as S, Se, Te, and a combination thereof has been attracting attention as a solar cell having high conversion efficiency (for example, see Patent Documents 1 and 2). For example, a CIGS solar cell has a structure in which a film including four types of semiconductor materials, namely, Cu, In, Ga, and Se is used as a light absorbing layer (photoelectric conversion layer).

In a CIGS solar cell, since it is possible to reduce the thickness of the light absorbing layer compared to a conventional solar cell, it is easy to install the CIGS solar cell on a curved surface and to transport the CIGS solar cell. For this reason, it is expected that CIGS solar cells can be used in various application fields as a high-performance, flexible solar cell. As a method of forming the light absorbing layer, a method of forming the light absorbing layer through depositing or sputtering is conventionally known (for example, see Patent Documents 2 to 4).

DOCUMENTS OF RELATED ART

Patent Documents

[Patent Document 1] Japanese Unexamined Patent Application, First Publication No. Hei 11-340482
[Patent Document 2] Japanese Unexamined Patent Application, First Publication No. 2005-51224
[Patent Document 3] Japanese Unexamined Patent Application, First Publication No. Hei 1-231313
[Patent Document 4] Japanese Unexamined Patent Application, First Publication No. Hei 11-273783
[Patent Document 5] Japanese Unexamined Patent Application, First Publication No. 2005-175344

By contrast, as the method of forming the light absorbing layer, the present inventor propose a method of coating the semiconductor materials in the form of a liquid material on a substrate. In such a method of forming the light absorbing layer by coating the semiconductor materials in the form of a liquid material, the following problems arise.

Among the semiconductor materials, Cu, In, and the like are metals susceptible to oxidation (i.e., oxidizable metals). When a liquid material including such oxidized metals is coated on the substrate under the conditions in which the oxygen concentration or humidity is high, the oxidizable metal is likely to be oxidized, which may cause deterioration in the film quality of the coating film. This problem is not limited to the case of forming a semiconductor film of a CIGS solar cell, but may generally arise in a coating operation using a liquid material including the oxidizable metals.

In order to solve the above-described problem, for example, as described in Patent Document 5, a technology has been proposed in which a main chamber is maintained in a hermetic state by a nitrogen-circulation cleaning unit and nitrogen is circulated via a high-performance filter so as to maintain a clean state. However, since a coating operation is performed using an organic material such as a photoresist as a target solution and metal is not a main component thereof, it is difficult to solve the above-described problem.

Further, it has been demanded to ensure safety, for example, upon performing the maintenance of the device.

SUMMARY OF THE INVENTION

The present invention takes the above circumstances into consideration, with an object of providing a coating apparatus and a coating method capable of ensuring the safety of an operation and suppressing the deterioration in film quality of a coating film including oxidizable metal.

According to one aspect of the present invention, there is provided a coating apparatus including a coating part which applies a liquid material including an oxidizable metal on a substrate; a chamber having a coating section in which the coating part applies the liquid material on the substrate and a transport section into which the liquid material is transported; an adjusting part which adjusts at least one of oxygen concentration and humidity inside the chamber; and a control part which stops an operation of the coating part in response to the entrance of foreign object into the chamber.

According to the coating apparatus of the present invention, since it is possible to stop the operation of the coating part when foreign object enter the chamber, for example, when a managing operation (for example, the maintenance or the like) of the coating part is performed by accessing the inside of the chamber, it is possible to ensure safety. Further, even when the atmosphere inside the chamber changes due to the entrance of foreign object, it is possible to prevent the liquid material from coming in contact with the atmosphere inside the chamber. As a result, it becomes possible to prevent the oxidization of the oxidizable metal included in the liquid material, which is advantageous in that deterioration in the film quality of the coating film can be suppressed.

In the coating apparatus, the chamber may include a managing area in which the coating part is managed, and the control part may stop the operation of the coating part in response to the entrance of foreign object into the managing area.

In this embodiment, by virtue of stopping the operation of the coating part in response to the entrance of foreign object into the managing area, it is possible to ensure safety, for example, in the case where the managing operation is performed by directly accessing the managing area. Further, even when the atmosphere inside the chamber changes due to the foreign object entering the managing area of the chamber, it is possible to prevent the oxidization of the liquid material inside the chamber.

In the coating apparatus, the chamber may include a detection device which detects the entrance of the foreign object.

In this embodiment, since it is possible to detect the entrance of the foreign object by using the detection device, it is possible to ensure safety when the managing operation is performed by directly accessing the inside of the chamber.

In the coating apparatus, the chamber may include a glove part which enables the access to the coating part, and the managing area may be an accessible area of the glove part.

In this embodiment, it is possible to ensure safety when a managing operation such as maintenance is performed by directly accessing the accessible area of the glove part. Further, even when the atmosphere in the accessible area changes, it is possible to prevent oxidization of the liquid material.

In the coating apparatus, the control part may not stop the operation of the coating part in a non-accessible area of the glove part.

In this embodiment, since stopping the operation of the coating part in the non-accessible area of the glove part is excluded from stopping the entire operation of the coating part, it is possible to ensure safety of the managing operation and to efficiently perform the operation of the coating apparatus. As a result, it is possible to ensure safety of the operation and to suppress the deterioration in the throughput.

In the coating apparatus, after the operation of the coating part is stopped, the control part may stop power supplied to at least the coating part.

In this embodiment, by virtue of stopping the power supplied to at least the coating part after the operation of the coating part is stopped, it is possible to reliably stop the driving of the coating part. As a result, it becomes possible to ensure safety when a managing operation such as maintenance of the coating part is performed. Further, the present invention is not limited to the above-configuration as long as the power supplied to the driving portion of the coating part is stopped.

According to another aspect of the invention, there is provided a coating method including coating a liquid material including an oxidizable metal on a substrate (coating step); adjusting at least one of oxygen concentration and humidity inside a chamber having a coating space in which the coating part applies the liquid material on the substrate and a transport space into which the liquid material is transported (adjusting step); and stopping coating the liquid material in response to the entrance of foreign object into the chamber (stopping step).

According to the coating method of the present invention, since it is possible to stop the coating step when foreign object enter the chamber, for example, when a managing operation (e.g., maintenance or the like) of the coating part is performed by accessing the inside of the chamber, it is possible to ensure safety. Further, even when the atmosphere inside the chamber changes due to the entrance of foreign object, it is possible to prevent the liquid material from coming in contact with the atmosphere inside the chamber upon entrance of the foreign object. As a result, it becomes possible to prevent the oxidization of the oxidizable metal included in the liquid material, which is advantageous in that deterioration in the film quality of the coating film can be suppressed.

In the coating method, the chamber may include a managing area in which the coating part is managed, and the stopping step may include stopping the operation of the coating part in response to the entrance of foreign object into the managing area.

In this embodiment, by virtue of the stopping step including stopping the operation of the coating part in response to the entrance of foreign object into the managing area, it is possible to ensure safety, for example, in the case where the managing operation is performed by directly accessing the managing area. Further, even when the atmosphere inside the chamber changes due to the foreign object entering the managing area of the chamber, it is possible to prevent the oxidization of the liquid material inside the chamber.

The coating method may further include detecting the entrance of foreign object (detection step).

In this embodiment, since the entrance of the foreign object is detected in the detection step, it is possible to ensure safety when the managing operation is performed by directly accessing the inside of the chamber.

In the coating method, the chamber may include a glove part which enables the access to the coating part, and the managing area may be an accessible area of the glove part.

In this embodiment, it is possible to ensure safety when a managing operation such as maintenance is performed by directly accessing the accessible area of the glove part. Further, even when the atmosphere in the accessible area changes, it is possible to prevent oxidization of the liquid material.

In the coating method, the stopping step may exclude stopping the operation of the coating part in a non-accessible area of the glove part.

In this embodiment, since stopping the operation of the coating part in the non-accessible area of the glove part is excluded from stopping the entire operation of the coating part, it is possible to ensure safety of the managing operation and to efficiently perform the operation of the coating apparatus. As a result, it is possible to ensure safety of the operation and to suppress the deterioration in the throughput.

In the coating method, after the operation of the coating part is stopped, power supplied to at least the coating part may be stopped in the stopping step.

In this embodiment, by virtue of stopping the power supplied to at least the coating part after the operation of the coating part is stopped, it is possible to reliably stop the driving of the coating part. As a result, it becomes possible to ensure safety when a managing operation such as maintenance of the coating part is performed. Further, the present invention is not limited to the above-configuration as long as the power supplied to the driving portion of the coating part is stopped.

Thus, according to the present invention, safety of an operation can be ensured, and the deterioration in film quality of a coating film including oxidizable metal can be suppressed.

DETAILED DESCRIPTION OF THE INVENTION

Figure 1:
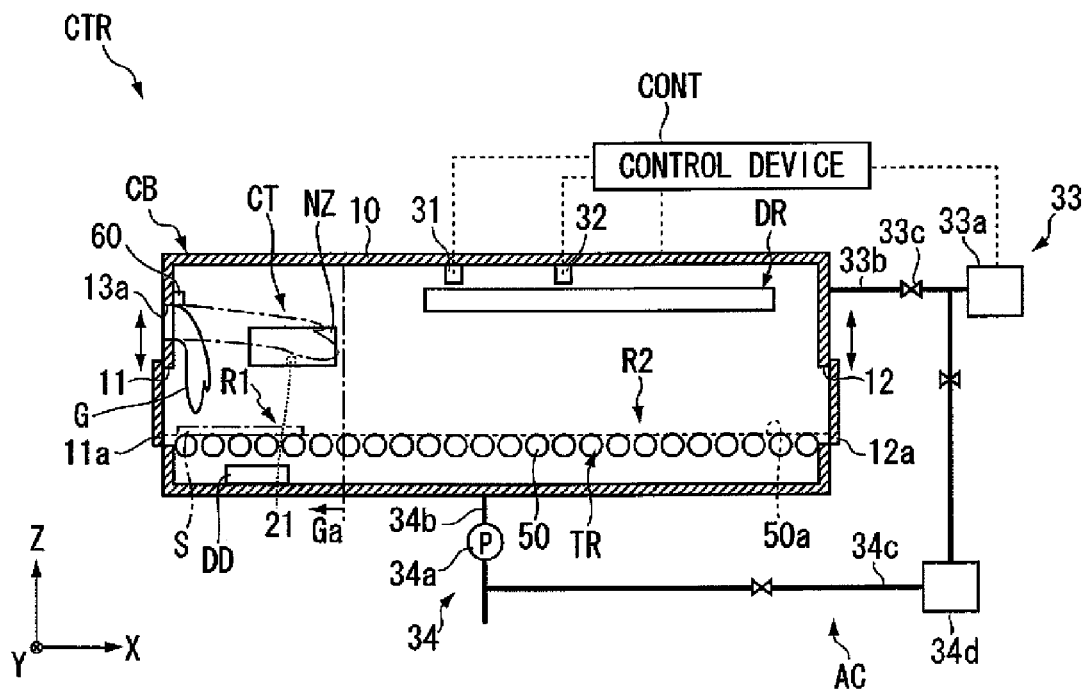
FIG. 1 is a diagram showing a configuration of a coating apparatus according to one embodiment of the present invention.

Hereinafter, one embodiment of the present invention will be described with reference to the accompanying drawings.

In the respective drawings as below, upon describing the configuration of a coating apparatus, for the purpose of simple marking, an XYZ coordinate system is used to describe the directions in the drawings. In the XYZ coordinate system, the horizontal direction in the drawing is marked as the X direction, and the direction perpendicular to the X direction in a plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

First Embodiment

Coating Apparatus

FIG. 1 is a schematic diagram showing a configuration of a coating apparatus CTR according to a first embodiment of the present invention.

As shown in FIG. 1, the coating apparatus CTR includes a chamber CB, a coating part CT, a application condition adjusting part AC, a drying part DR, a substrate transporting part TR, and a control device CONT. The coating apparatus CTR is an apparatus which applies a liquid material on a substrate S inside the chamber CB.

In this embodiment, as the liquid material, for example, a liquid composition is used which includes a solvent such as hydrazine and oxidizable metals such as copper (Cu), indium (In), gallium (Ga), and selenium (Se). The liquid composition includes a metal material for forming a light absorbing layer (photoelectric conversion layer) of a CIGS solar cell. Needless to say, as the liquid material, a liquid material in which another oxidizable metal is dispersed in the solution may be used. In this embodiment, as the substrate S, for example, a plate-shaped member made of glass, resin, or the like may be used.

(Chamber)

The chamber CB includes a housing 10, a substrate loading opening 11, and a substrate unloading opening 12. The housing 10 is adapted to accommodate the substrate S. The substrate loading opening 11 and the substrate unloading opening 12 are openings formed in the housing 10. The substrate loading opening 11 is formed in, for example, the −X-direction-side end portion of the housing 10. The substrate unloading opening 12 is formed in, for example, the +X-direction-side end portion of the housing 10. The substrate loading opening 11 and the substrate unloading opening 12 are connected to, for example, a load lock chamber (not shown).

The substrate loading opening 11 is provided with a shutter member 11a. The shutter member 11a is adapted to be movable in the Z direction, and is adapted to open or close the substrate loading opening 11. The substrate unloading opening 12 is provided with a shutter member 12a. In the same manner as the shutter member 11a, the shutter member 12a is adapted to be movable in the Z direction, and is adapted to open or close the substrate unloading opening 12. When the shutter members 11a and 12a are both in a closed state, the inside of the chamber CB is hermetically closed. FIG. 1 shows the state in which the shutter members 11a and 12a are closed.

A glove part G is provided on the substrate loading opening 11-side of the chamber CB. The glove part G is, for example, a part where an operator accesses the inside of the chamber CB. A wall portion on the substrate loading opening 11-side of the chamber CB is provided with an opening 13a. The glove part G is mounted on the wall portion so as to seal the opening 13a from the inside of the chamber CB. As such, the opening 13a is covered with the glove part G.

The glove part G is formed in the shape of a sac. An operator can perform a maintenance operation and the like in an accessible area Ga inside the chamber CB by inserting, for example, a hand into the glove part G. The accessible area Ga is configured in, for example, a space including the coating part CT. As such, the operator is capable of accessing the coating part CT via the glove part G. The chamber CB is provided with a detection mechanism 60 which is provided on the inside of the opening 13a. The detection mechanism 60 transmits a detection signal to the control device CONT when the operator inserts a hand into the glove part G.

(Coating Part)

The coating part CT is accommodated in the housing 10 of the chamber CB. The coating part CT includes a slit nozzle NZ which is formed in an elongated shape. The slit nozzle NZ is provided, for example, in the vicinity of the substrate loading opening 11 inside the chamber CB. The slit nozzle NZ is formed to be elongated in, for example, the Y direction.

Figure 2:
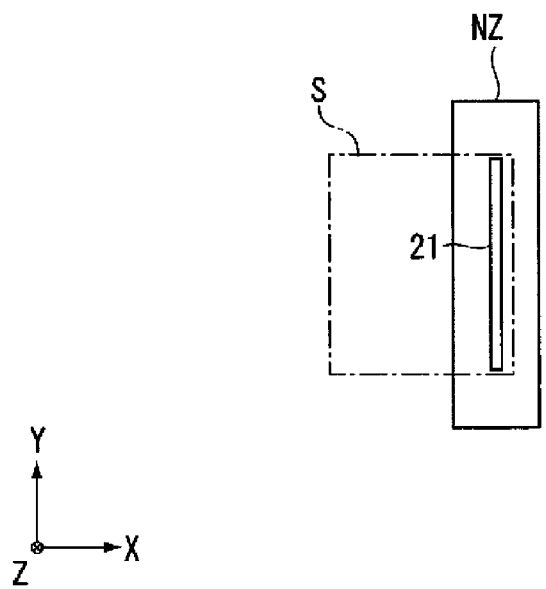
FIG. 2 is a diagram showing a configuration of a part of the coating apparatus according to one embodiment of the present invention.

FIG. 2 is a diagram showing a configuration of the slit nozzle NZ. FIG. 2 shows the configuration when the slit nozzle NZ is viewed from the −Z direction side thereof to the +Z direction side thereof.

As shown in FIG. 2, the slit nozzle NZ has a nozzle opening 21. The nozzle opening 21 is an opening for ejecting a liquid material. The nozzle opening 21 is formed in, for example, the Y direction so as to follow the longitudinal direction of the slit nozzle NZ. The nozzle opening 21 is formed, for example, so that the longitudinal direction thereof is substantially equal to the Y-direction dimension of the substrate S.

The slit nozzle NZ ejects, for example, a liquid material in which four types of metals, namely, Cu, In, Ge, and Se are mixed with a predetermined composition ratio. The slit nozzle NZ is connected to a supply source (not shown) of the liquid material via a connection pipe (not shown). The slit nozzle NZ includes a holding portion which holds the liquid material therein. The slit nozzle NZ includes a temperature controlling mechanism (not shown) which controls the temperature of the liquid material held by the holding portion.

The slit nozzle NZ is provided with, for example, a moving mechanism (not shown) which is adapted to be movable between, for example, a standby position (for example, a position shown in FIG. 6) and a coating position (a position shown in FIG. 1) inside the chamber CB. The standby position of the slit nozzle NZ is provided with, for example, a dummy ejection mechanism DD which conducts a dummy ejection of the liquid material. The dummy ejection mechanism is provided with, for example, a bubble sensor (not shown) which detects a bubble of the liquid material.

(Application Condition Adjusting Part)

Returning to FIG. 1, the application condition adjusting part AC includes an oxygen concentration sensor 31, a pressure sensor 32, an inert gas supply part 33, and a discharge part 34.

The oxygen concentration sensor 31 detects the oxygen concentration inside the chamber CB, and transmits the detection result to the control device CONT. The pressure sensor 32 detects a pressure inside the chamber CB, and transmits the detection result to the control device CONT. There may be plural numbers of the oxygen concentration sensors 31 and the pressure sensors 32. In FIG. 1, the oxygen concentration sensor 31 and the pressure sensor 32 are mounted to the ceiling portion of the housing 10 of the chamber CB, although they may be provided in other portions.

The inert gas supply part 33 supplies, for example, an inert gas such as nitrogen gas or argon gas to the inside of the housing 10 of the chamber CB. The inert gas supply part 33 includes a gas supply source 33a, a conduit 33b, and a supply amount adjusting part 33c. As the gas supply source 33a, for example, a gas cylinder or the like may be used.

One end of the conduit 33b is connected to the gas supply source 33a, and the other end thereof is connected to the inside of the housing 10 of the chamber CB. The end portion of the conduit 33b connected to the chamber CB is an inert gas supply port in the chamber CB. The inert gas supply port is disposed on the +Z direction side of the housing 10.

The supply amount adjusting part 33c is a part which adjusts the amount of the inert gas supplied to the inside of the housing 10. As the supply amount adjusting part 33c, for example, an electromagnetic valve or a valve which is manually opened or closed may be used. The supply amount adjusting part 33c is provided in, for example, the conduit 33b. The supply amount adjusting part 33c may be directly installed in, for example, the gas supply source 33a, instead of disposing in the conduit 33b.

The discharge part 34 discharges a gas inside the housing 10 of the chamber CB to the outside of the housing 10. The discharge part 34 includes a discharge driving source 34a, a conduit 34b, a conduit 34c, and a removing member 34d. The discharge driving source 34a is connected to the inside of the housing 10 via the conduit 34b. As the discharge driving source 34a, for example, a pump or the like may be used. The conduit 34b has a discharge port which is provided in an end portion thereof provided inside the housing 10. The discharge port is disposed on the −Z direction side of the housing 10.

By such a configuration in which the inert gas supply port is disposed on the +Z direction side of the housing 10 and the discharge port is disposed on the −Z direction side of the housing 10, the gas inside the housing 10 flows in the −Z direction. In this manner, it is possible to suppress the gas inside the housing 10 from whirling around.

One end of the conduit 34c is connected to the discharge driving source 34a, and the other end thereof is connected to the conduit 33b of the inert gas supply part 33. The conduit 34c is used as a circulation path which circulates the gas discharged by the discharge driving source 34a from the inside of the housing 10 to the supply path. In this manner, the discharge part 34 is also used as a circulating mechanism which circulates the gas inside the housing 10. The connection portion of the conduit 34c is not limited to the conduit 33b of the inert gas supply part 33, but for example, the conduit 34c may be directly connected to the inside of the housing 10. In the conduit 34c, for example, valves are respectively provided on the upstream side and the downstream side of a removing member 34d.

The removing member 34d is provided inside the conduit 34c. As the removing member 34d, for example, an absorbing material for absorbing an oxygen component and moisture contained in the gas circulating in the conduit 34c is used. In this manner, it is possible to clean the circulated gas. The removing member 34d may be disposed at one position inside the conduit 34c, or may be disposed throughout the conduit 34c.

(Drying Part)

The drying part DR is a part which dries the liquid material coated on the substrate S. The drying part DR includes a heating mechanism such as an infrared unit. The drying part DR is adapted to heat and dry the liquid material by using the heating mechanism. The drying part DR is provided at a position not overlapping with the nozzle NZ in plan view. More specifically, the drying part DR is disposed on the +X direction side of the slit nozzle NZ. For this reason, the action of the drying part DR (e.g., irradiation of infrared ray) hardly influences the slit nozzle NZ, and thus the liquid material inside the slit nozzle NZ is hardly dried. By such a configuration in which the drying part DR is not disposed on the +Z direction side of the slit nozzle NZ, it is possible to prevent clogging of the nozzle opening 21 formed in the nozzle NZ, thereby preventing a change in quality of the liquid composition including the oxidizable metal materials.

(Substrate Transporting Part)

The substrate transporting part TR is a part which transports the substrate S inside the housing 10. The substrate transporting part TR includes a plurality of roller members 50. The roller members 50 are arranged in the X direction from the substrate loading opening 11 to the substrate unloading opening 12. Each roller member 50 is adapted to be rotatable about the Y direction serving as the central axis.

The plurality of roller members 50 are formed to have the same diameter, and are disposed at the same position in the Z direction. The +Z-direction-side upper ends of the roller members 50 are adapted to support the substrate S. For this reason, the support positions of the roller members 50 are formed on the same plane, and a transporting plane 50a for the substrate S is formed by the plural roller members 50.

The transporting plane 50a for the substrate S is formed so that a loading position of the substrate S at the substrate loading opening 11 and an unloading position of the substrate S at the substrate unloading opening 12 are equal to each other in the Z direction. In this manner, the substrate S is reliably transported from the substrate loading opening 11 to the substrate unloading opening 12 without any change in the Z-direction position thereof.

In the space above the substrate transporting plane 50a inside the chamber CB, a space on the −Z direction side of the slit nozzle NZ becomes a coating space R1 where the liquid material is applied on the substrate S. In the space above the substrate transporting plane 50a inside the chamber CB, a space on the +X direction side of the slit nozzle NZ becomes a transport space R2 (transporting space R2) where the substrate S coated with the liquid material is transported.

(Control Device)

The control device CONT is a part which has the overall control of the coating apparatus CTR. More specifically, the control device CONT controls, for example, an opening-closing operation using the shutter members 11a and 12a of the chamber CB, a transporting operation using the substrate transporting part TR, a coating operation using the coating part CT, a drying operation using the drying part DR, and an adjusting operation using the application condition adjusting part AC. As an example of the adjusting operation, the control device CONT controls an opening degree of the supply amount adjusting part 33c of the inert gas supply part 33 on the basis of the detection result obtained by the oxygen concentration sensor 31 and the pressure sensor 32.

[Coating Method]

Next, a coating method according to one embodiment of the present invention will be described. In this embodiment, a coating film is formed on the substrate S by using the coating apparatus CTR having the above-described configuration. The operations performed by the respective portions of the coating apparatus CTR are controlled by the control device CONT.

The control device CONT adjusts the atmosphere inside the chamber CB to be an inert gas atmosphere. More specifically, an inert gas is supplied to the inside of the chamber CB by using the inert gas supply part 33. In this case, the control device CONT may adjust the pressure inside the chamber CB by appropriately operating the discharge part 34.

In addition, the control device CONT controls the holding portion of the slit nozzle NZ to hold the liquid material therein. The control device CONT controls the temperature of the liquid material held by the holding portion by using the temperature controlling mechanism inside the slit nozzle NZ.

In this manner, the control device CONT controls the slits nozzle NZ so as to be in a state capable of ejecting the liquid material to the substrate S.

When the coating apparatus CTR is in the state capable of ejecting the liquid material to the substrate S, the control device CONT loads the substrate S from the load lock chamber into the chamber CB. More specifically, the control device CONT moves up the shutter member 11a of the substrate loading opening 11, and loads the substrate S into the chamber CB via the substrate loading opening 11.

Figure 3:
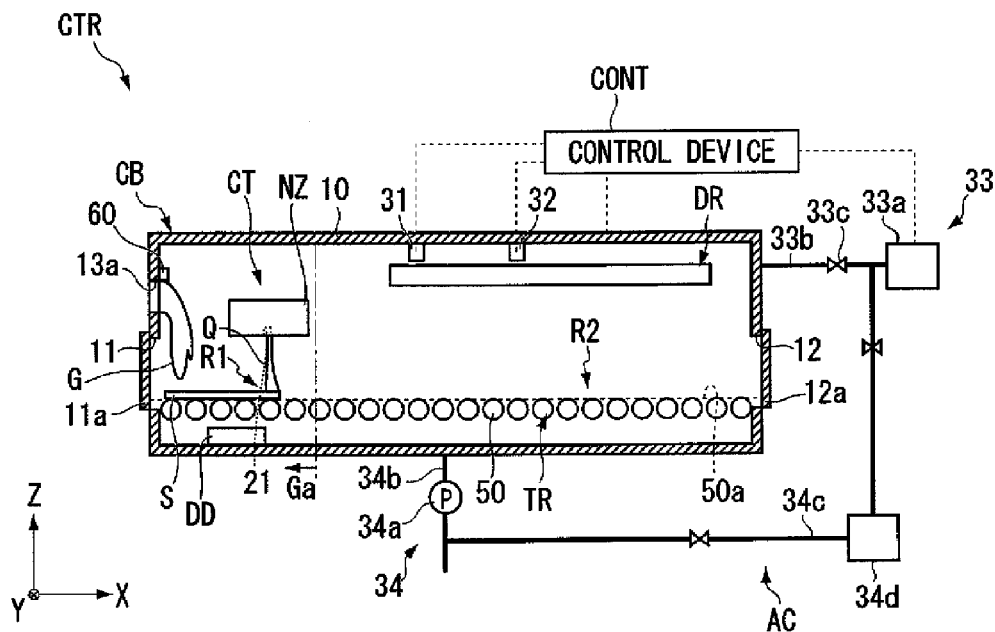
FIG. 3 is a diagram showing an operation of the coating apparatus according to one embodiment of the present invention.

After the substrate S is loaded into the chamber CB, the control device CONT rotates the roller members 50 of the substrate transporting part TR so as to move the substrate S in the +X direction. When the +X-direction-side edge of the substrate S arrives at a position overlapping with the nozzle opening 21 of the slit nozzle NZ as viewed from the Z direction, as shown in FIG. 3, the control device CONT operates the slit nozzle NZ so as to eject a liquid material Q from the nozzle opening 21.

Figure 4:
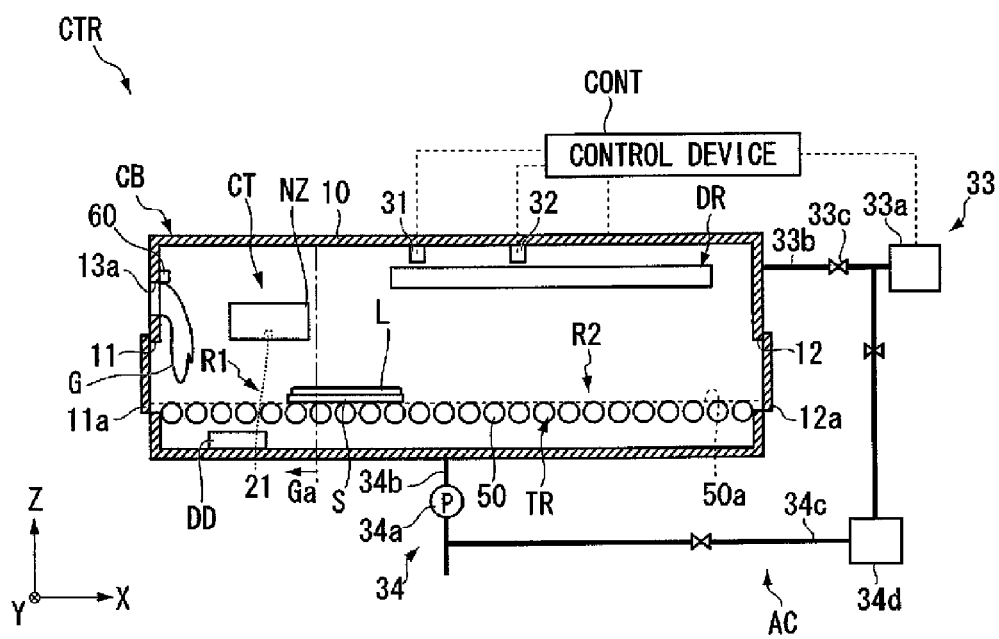
FIG. 4 is a diagram showing an operation of the coating apparatus according to one embodiment of the present invention.

The control device CONT rotates the roller members 50 while ejecting the liquid material Q from the nozzle opening 21 in the state where the position of the slit nozzle NZ is fixed. By this operation, the liquid material is coated on the substrate S from the +X direction side thereof to the −X direction side thereof in accordance with the movement of the substrate S. As shown in FIG. 4, a coating film L of the liquid material is formed on a predetermined area of the substrate S (coating step). After the coating film L is formed on the substrate S, the control device CONT stops the operation of ejecting the liquid material from the nozzle opening 21.

Figures 5, 6:
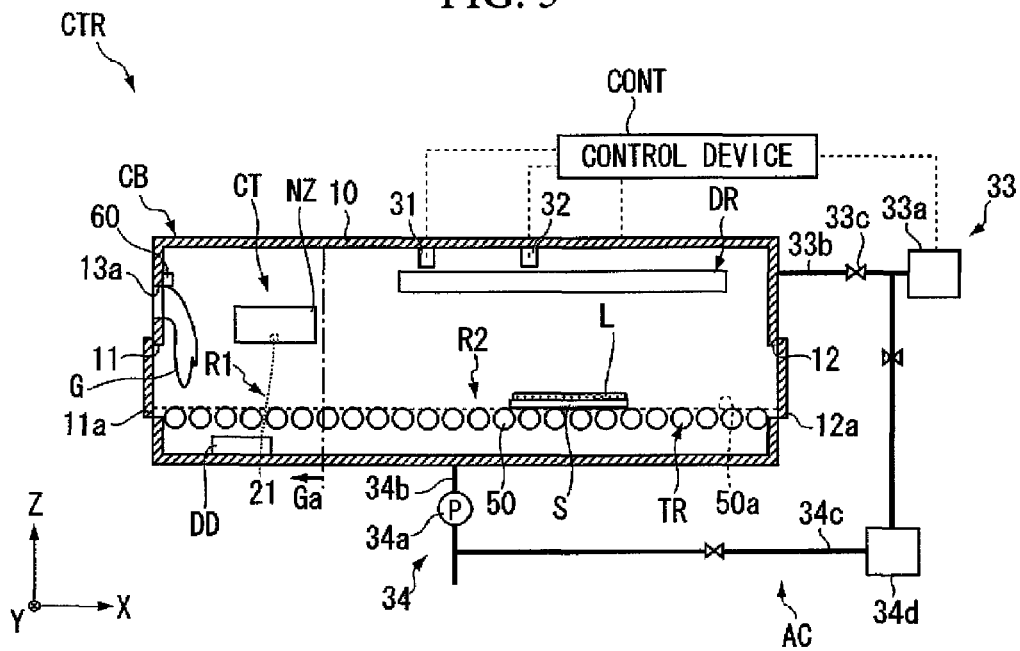
FIG. 5 is a diagram showing an operation of the coating apparatus according to one embodiment of the present invention.
FIG. 6 is a diagram showing an operation of the coating apparatus according to one embodiment of the present invention.

After the ejecting operation stops, as shown in FIG. 5, the control device CONT operates the drying part DR so as to dry the coating film on the substrate S. The control device CONT, for example, stops the rotation operation of the roller members 50, and operates the drying part DR while the substrate S is in a stationary state. For example, the time required for drying the coating film L on the substrate S and/or the drying temperature is memorized in advance, and the control device CONT performs a drying operation of the coating film L by controlling the drying time and the drying temperature on the basis of the memorized values.

In the case where a part of a light absorbing layer is formed by coating the liquid material Q including oxidizable metals on the substrate S, for example, since Cu, In and the like are metals which are susceptible to oxidation (oxidizable metals), when the oxygen concentration inside the chamber CB is high, the oxidizable metals are oxidized. When the metals are oxidized, the film quality of the coating film formed on the substrate S may deteriorate.

In the present embodiment, the control device CONT adjusts the oxygen concentration inside the chamber CB by using the application condition adjusting part AC. More specifically, the control device CONT supplies an inert gas to the inside of the chamber CB by using the inert gas supply part 33. In this case, the control device CONT first detects the oxygen concentration inside the chamber CB by using the oxygen concentration sensor 31, and supplies the inert gas to the inside of the chamber CB while adjusting the supply amount of the inert gas using the supply amount adjusting part 33c on the basis of the detection result.

For example, when the detected oxygen concentration exceeds a predetermined threshold value, it is possible to supply the inert gas into the chamber CB. The threshold value may be obtained in advance by a test or simulation, and may be stored in the control device CONT. In addition, for example, a predetermined amount of the inert gas may be constantly supplied into the chamber CB during the coating operation and the drying operation, and the inert gas supply amount can be increased or decreased on the basis of the detection result of the oxygen concentration sensor 31.

In addition to detecting the oxygen concentration, the control device CONT detects the atmospheric pressure inside the chamber CB by using the pressure sensor 32. The control device CONT supplies the inert gas to the inside of the chamber CB while adjusting the gas supply amount of the inert gas by using the supply amount adjusting part 33c on the basis of the detection result of the pressure sensor 32.

For example, when the atmospheric pressure inside the chamber CB exceeds a predetermined threshold value, the gas inside the chamber CB is discharged by using the discharge part 34. This threshold value may be obtained in advance by a test or simulation, and may be stored in the control device CONT. In addition, for example, a predetermined amount of the gas inside the chamber CB may be constantly discharged during the coating operation and the drying operation, and the discharge amount can be increased or decreased on the basis of the detection result of the pressure sensor 32.

The gas discharged from the discharge part 34 is circulated to the conduit 33b of the inert gas supply part 33 via the conduits 34b and 34c. When the gas flows through the conduit 34c, the gas passes through the removing member 34d. When the gas passes through the removing member 34d, the oxygen component in the gas is adsorbed by the removing member 34d so as to be removed from the gas. In this manner, an inert gas having a low oxygen concentration is circulated to the conduit 33b. By circulating the gas inside the chamber CB, it becomes possible to supply the inert gas under stable temperature conditions.

When the maintenance of the coating apparatus CTR is performed, the operator is capable of accessing the inside of the chamber CB, for example, by inserting a hand into the glove part G. For example, as shown in FIG. 6, when the operator inserts a hand into the glove part G, the detection device 60 detects the operator's action by detecting a foreign object entering the chamber CB, and transmits a detection signal to the control device CONT (detection step).

After the control device CONT receives the detection signal from the detection device 60, the control device CONT stops the operation in the accessible area Ga of the glove part G (stopping step). The accessible area Ga includes the coating part CT, (a part of) the transporting mechanism TR, and the dummy ejection mechanism DD. The control device CONT temporarily stops the operations of the coating part CT, a part of the transporting mechanism TR, and the dummy ejecting mechanism DD. After the operation has been stopped, the control device CONT turns off at least a driving portion of the coating part CT so as to stop the power supplied to the driving portion of the coating part CT. In this manner, the control device CONT stops the operation of driving the coating part CT.

At this time, the control device CONT may turn off the driving portions of the components included in the accessible area Ga. For example, detection devices 60 may be arranged at a plurality of positions inside the accessible area Ga of the chamber CB, and it may be determined whether to turn off only the driving portion of the coating part CT or to turn off the driving portions of the respective components inside the accessible area Ga, depending on the access position of the glove part G (a detection position detected by the detection device 60).

The operator can safely perform the maintenance operation inside the chamber CB while the driving operation inside the accessible area Ga is being stopped. After the operator finishes the maintenance operation and extracts the hand from the glove part for example, when the operator turns on the driving portion of the coating apparatus CTR, the driving operation of the coating apparatus CTR is resumed. Alternatively, the detection can be performed as follows. The operator's action of extracting the hand is detected by the detection device 60, and the detection signal is transmitted to the control device CONT. After the control device CONT receives the detection signal, the control device CONT turns on the respective components included in the accessible area Ga. In this manner, the operation of the coating apparatus CTR can be automatically resumed.

The operator can perform maintenance by inserting the hand into the glove part G even when the driving operation of the coating part CT is being performed. Also in this case, the detection mechanism 60 transmits the detection signal to the control device CONT in the same manner as described above. After the control device CONT receives the detection signal from the detection mechanism 60, the control device CONT stops the operations inside the accessible area Ga even when the driving operations are being performed, and turns off the driving portions therein. In this manner, even when maintenance is required for example during driving operations, the coating apparatus can be handled promptly.

As described above, according to the present embodiment, since it is possible to stop the operation of the coating part CT when a foreign object enters the chamber CB, for example, in the case where the managing operation (for example, the maintenance or the like) of the coating part CT is performed by accessing the inside of the chamber CB via the glove part G, it is possible to ensure safety. Further, even when the atmosphere inside the chamber CB changes due to the entrance of the foreign object, it is possible to prevent the liquid material from coming in contact with the atmosphere inside the chamber CB in the event of the entrance of the foreign object. Therefore, it becomes possible to prevent the oxidization of the oxidizable metal included in the liquid material, thereby preventing the deterioration in film quality of the coating film L.

Second Embodiment

Next, a second embodiment of the present invention will be described. The second embodiment is different from the first embodiment in that a plurality of coating parts CT and a plurality of drying parts DR are provided inside the chamber CB. Therefore, the differing points will be mainly described below. In the second embodiment, the same reference numerals will be given to the same components as those of the first embodiment, and the description thereof will be omitted or simplified.

Figure 7:
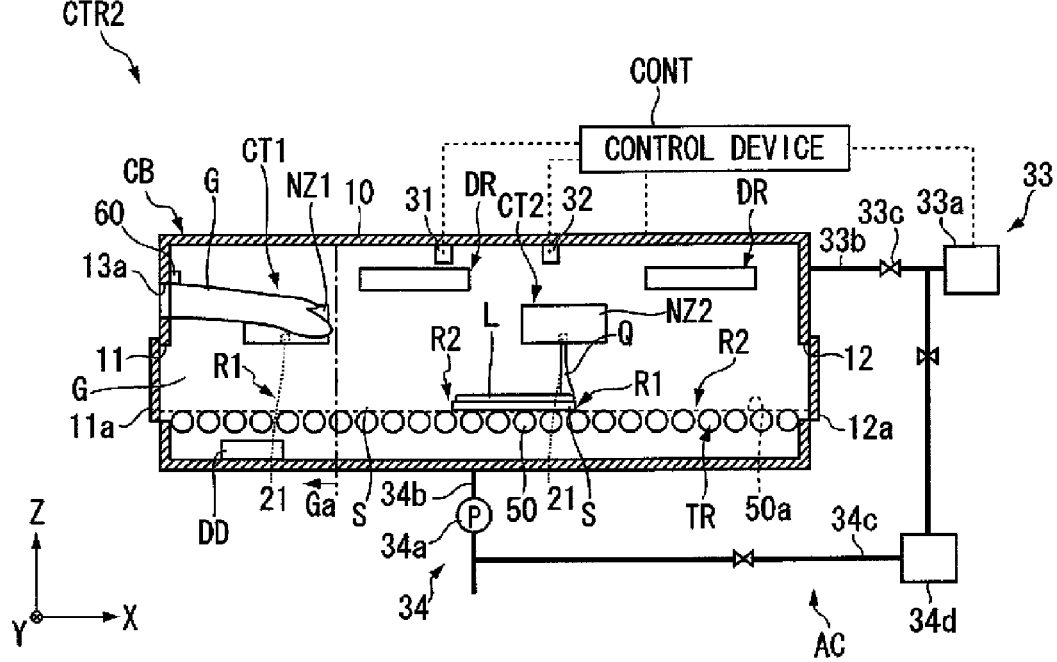
FIG. 7 is a diagram showing a configuration of a coating apparatus according to a second embodiment of the present invention.

FIG. 7 is a diagram showing a configuration of a coating apparatus CTR2 according to a second embodiment of the present invention. As shown in FIG. 7, in the chamber CB, the coating parts CT and the drying parts DR are alternately arranged in the substrate transporting direction (+X direction). For example, two coating parts CT and two drying portions DR are provided. In this embodiment, the slit nozzle NZ of each coating part CT is also disposed at a position not overlapping with the drying parts DR as viewed from the Z direction.

In this embodiment, the accessible area Ga of the glove part G is configured in a space including a coating part CT1 disposed on the upstream side in the substrate transporting direction, and a coating part CT2 disposed on the downstream side in the substrate transporting direction is not included in the accessible area Ga. Accordingly, the operator is capable of accessing only the coating part CT1 disposed on the upstream side in the substrate transporting direction via the glove part G. The chamber CB is provided with a detection mechanism 60 which is provided on the inside of the opening 13a. The detection mechanism 60 transmits a detection signal to the control device CONT when the operator inserts a hand into the glove part G.

When the coating operation is performed by using the coating apparatus CTR2, for example, it becomes possible to add a layer by using the coating parts CT1 and CT2. The control device CONT first performs a coating operation using the slit nozzle NZ1 provided in the coating part CT1, and dries the coating film L using the drying portion DR disposed on the upstream side in the substrate transporting direction. Subsequently, the control device CONT transports the substrate S in the +X direction, and ejects the liquid material Q onto the coating film L by using the slit nozzle NZ2. In this manner, a multi-layered coating film L can be formed on the substrate S by using the coating parts CT1 and CT2.

In the maintenance of the coating apparatus CTR1, as in the first embodiment, the operator is capable of accessing the inside of the chamber CB, for example, by inserting a hand into the glove part G. When the operator inserts the hand into the glove part G the detection mechanism 60 detects the operator's action by detecting the object entering the chamber CB, and transmits the detection signal to the control device CONT.

After the control device CONT receives the detection signal from the detection device 60, the control device CONT stops the operation in the accessible area Ga of the glove part G. At this time, when the coating operation is being performed inside the accessible area Ga by using the coating part CT1, the control device CONT stops the coating operation. On the other hand, when the coating operation is performed outside the accessible area Ga of the glove part G (inside a non-accessible area) by using the coating part CT2, the coating operation may not be stopped. After the coating operation using the coating part CT2 is finished, when the substrate S is not required to be transported to the accessible area Ga, the control device CONT directly unloads the substrate S via the substrate unloading opening 12. On the other hand, when the substrate S is required to be transported to the accessible area Ga (for example, when the coating operation is performed again by using the coating part CT1), the control device CONT transports the substrate S to the accessible area Ga and then stops the operation.

As described above, according to this embodiment, even when the operator's hand enters the chamber CB via the glove part G, since the coating part CT2 which is disposed outside the accessible area Ga of the glove part G is hardly influenced by the entered object, there is no need to stop the coating operation of the coating part CT2. Therefore, it is possible to efficiently perform the coating operation. As a result, it is possible to suppress the deterioration in the throughput while ensuring the safety of the operation performed by the operator.

The technical scope of the present invention is not limited to the above-described embodiment, but may be appropriately modified into various forms without departing from the spirit of the present invention.

For example, in the above-described embodiments, one glove part G is disposed at a position where the substrate S is loaded, and the maintenance is performed by accessing the coating part CT (or the coating part CT1), but the present invention is not limited thereto. For example, the glove part G may be disposed at a position where the substrate S is unloaded, so that maintenance of the drying portion DR (or the coating part CT2) can be performed. Further, for example, the glove part G may be disposed on the side perpendicular to the paper surfaces of FIGS. 1 and 7 or the opposite side thereof, that is, the side wall portion of the chamber CB in the transporting direction of the substrate S, so that any position inside the chamber CB is accessible.

Further, in the above-described embodiments, the oxygen concentration inside the chamber CB is detected so that the inert gas is supplied on the basis of the detection result, but the present invention is not limited thereto. For example, the humidity inside the chamber CB may be detected so as to adjust the inert gas supply amount on the basis of the detected humidity. In this case, for example, the chamber CB is provided with a humidity sensor in addition to the oxygen concentration sensor 31. Alternatively, a humidity sensor may be disposed instead of the oxygen concentration sensor 31.

In the above-described embodiment, the coating part CT includes the slit nozzle NZ, but the present invention is not limited thereto. For example, a dispenser coating part or an ink jet coating part may be used. Alternatively, for example, the liquid material disposed on the substrate S may be diffused by using a squeezer or the like so as to be coated thereon.

In the above-described embodiment, the slit nozzle NZ constituting the coating part CT is fixed, but the present invention is not limited thereto. For example, a moving mechanism for moving the slit nozzle NZ may be provided so as to move the slit nozzle NZ.

In the above-described embodiment, the roller members 50 are used as the substrate transporting part TR, but the present invention is not limited thereto. For example, the substrate S may be transported by using a floating mechanism to lift the substrate S. In this case, the floating mechanism may be selectively disposed in an area where the slit nozzle NZ is disposed inside the chamber CB. By such a configuration, it is possible to precisely control the film thickness of the coating film formed on the substrate S.

In the above-described embodiments, as an example of a foreign object entering the chamber CB, the operator's hand inserted into the glove part G is given, but the present invention is not limited thereto. For example, other intruding objects may be detected and the coating operation therein may be stopped.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A coating apparatus comprising:
    a coating part comprising a slit nozzle which applies a liquid material including an oxidizable metal on a substrate;
    a glove part which provides access to the coating part by an operator;
    a chamber comprising a coating section in which the coating part applies the liquid material on the substrate and a transport section onto which a substrate which has received the liquid material is transported, a managing area in which the coating part is managed and where the glove part is accessible, and a detection device which detects the entrance of the glove part;
    an adjusting part which adjusts at least one of oxygen concentration and humidity inside the chamber; and
    a control part configured to stop an operation of the coating part in response to the entrance of the glove part into the managing area.

2. The coating apparatus according to claim 1, wherein the control part does not stop the operation of the coating part in a non-accessible area of the glove part.

3. The coating apparatus according to claim 1, wherein after the operation of the coating part is stopped, the control part stops power supplied to at least the coating part.

* * * * *